United States Patent
Rachmady et al.

(10) Patent No.: US 10,903,364 B2
(45) Date of Patent: Jan. 26, 2021

(54) SEMICONDUCTOR DEVICE WITH RELEASED SOURCE AND DRAIN

(71) Applicant: Intel Corporation, Santa Clara, CA (US)

(72) Inventors: Willy Rachmady, Beaverton, OR (US); Sanaz K. Gardner, Portland, OR (US); Chandra S. Mohapatra, Beaverton, OR (US); Matthew V. Metz, Portland, OR (US); Gilbert Dewey, Hillsboro, OR (US); Sean T. Ma, Portland, OR (US); Jack T. Kavalieros, Portland, OR (US); Anand S. Murthy, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/304,620

(22) PCT Filed: Jul. 2, 2016

(86) PCT No.: PCT/US2016/040900
§ 371 (c)(1),
(2) Date: Nov. 26, 2018

(87) PCT Pub. No.: WO2018/009162
PCT Pub. Date: Jan. 11, 2018

(65) Prior Publication Data
US 2019/0172941 A1    Jun. 6, 2019

(51) Int. Cl.
*H01L 29/78*    (2006.01)
*H01L 29/775*    (2006.01)
(Continued)

(52) U.S. Cl.
CPC ........ *H01L 29/785* (2013.01); *H01L 29/0673* (2013.01); *H01L 29/41791* (2013.01);
(Continued)

(58) Field of Classification Search
CPC ............... H01L 29/785; H01L 29/0673; H01L 29/41791; H01L 29/66469; H01L 29/66795; H01L 29/775
See application file for complete search history.

(56) References Cited

U.S. PATENT DOCUMENTS

| 2011/0147812 A1* | 6/2011 | Steigerwald | .......... H01L 29/785 257/288 |
| 2013/0154016 A1* | 6/2013 | Glass | .................... H01L 29/267 257/368 |

(Continued)

OTHER PUBLICATIONS

International Preliminary Report on Patentability for International Patent Application No. PCT/US2016/040900, dated Jan. 17, 2019, 10 pages.

(Continued)

*Primary Examiner* — Nathan W Ha
(74) *Attorney, Agent, or Firm* — Schwabe, Williamson & Wyatt, P.C.

(57) ABSTRACT

Embodiments are generally directed to a semiconductor device with released source and drain. An embodiment of a method includes etching a buffer layer of a semiconductor device to form a gate trench under a gate channel portion of a channel layer of the device; filling the gate trench with an oxide material to form an oxide isolation layer; etching one or more source/drain contact trenches in an interlayer dielectric (ILD) layer for source and drain regions of the device; etching the oxide isolation layer within the one or more source/drain contact trenches to form one or more cavities under a source/drain channel in the source and drain regions, wherein the etching of each contact trench is to expose all (Continued)

sides of the source/drain channel; and depositing contact metal in the one or more contact trenches, including depositing the contact metal in the cavities under the source/drain channel.

10 Claims, 21 Drawing Sheets

(51) Int. Cl.
    *H01L 29/417*     (2006.01)
    *H01L 29/66*     (2006.01)
    *H01L 29/06*     (2006.01)

(52) U.S. Cl.
    CPC .. *H01L 29/66469* (2013.01); *H01L 29/66795* (2013.01); *H01L 29/775* (2013.01)

(56) References Cited

U.S. PATENT DOCUMENTS

| | | | |
|---|---|---|---|
| 2013/0187229 A1* | 7/2013 | Cheng | H01L 29/4908 257/347 |
| 2013/0240989 A1* | 9/2013 | Glass | H01L 29/36 257/335 |
| 2014/0017890 A1* | 1/2014 | Cohen | H01L 29/413 438/675 |
| 2014/0191321 A1 | 7/2014 | Cheng et al. | |
| 2014/0203370 A1* | 7/2014 | Maeda | H01L 29/41791 257/365 |
| 2015/0162403 A1 | 6/2015 | Oxland | |
| 2015/0200260 A1 | 7/2015 | Yu et al. | |
| 2015/0206942 A1* | 7/2015 | Glass | H01L 29/7833 257/335 |
| 2015/0263137 A1* | 9/2015 | Chen | H01L 21/26506 438/283 |
| 2015/0279996 A1* | 10/2015 | He | H01L 21/283 257/288 |
| 2015/0380305 A1 | 12/2015 | Basker et al. | |
| 2016/0104787 A1 | 4/2016 | Kittl et al. | |
| 2016/0148936 A1* | 5/2016 | Xu | H01L 21/823821 257/369 |
| 2016/0233164 A1* | 8/2016 | Choi | H01L 29/785 |
| 2016/0380052 A1* | 12/2016 | Kim | H01L 27/1211 |
| 2017/0162575 A1* | 6/2017 | Li | H01L 21/32115 |
| 2018/0248028 A1* | 8/2018 | Mohapatra | H01L 21/02381 |

OTHER PUBLICATIONS

International Search Report and Written Opinion for International Patent Application No. PCT/US2016/040900 dated Apr. 28, 2017, 13 pgs.

Office Action from Taiwan Patent Application No. 106117691, dated Oct. 6, 2020, 10 pages.

* cited by examiner

FINCUT UNDER GATE

FINCUT ON SOURCE/DRAIN

FINCUT UNDER GATE

FINCUT ON SOURCE/DRAIN

FINCUT UNDER GATE

FINCUT ON SOURCE/DRAIN

FINCUT UNDER GATE

FINCUT ON SOURCE/DRAIN

FINCUT UNDER GATE

FINCUT ON SOURCE/DRAIN

FINCUT UNDER GATE

FINCUT ON SOURCE/DRAIN

SEMICONDUCTOR DEVICE WITH RELEASED SOURCE AND DRAIN

CROSS-REFERENCE TO RELATED APPLICATION

This patent application is a U.S. National Phase Application under 35 U.S.C. § 371 of International Application No. PCT/US2016/040900, filed Jul. 2, 2016, entitled "SEMICONDUCTOR DEVICE WITH RELEASED SOURCE AND DRAIN," which designates the United States of America, the entire disclosure of which is hereby incorporated by reference in its entirety and for all purposes.

TECHNICAL FIELD

Embodiments described herein generally relate to the field of semiconductor devices and, more particularly, a semiconductor device with released source and drain.

BACKGROUND

The scaling of features in integrated circuits to smaller and smaller sizes continues to be an essential element of semiconductor design and fabrication, with the density of components continuing to rise. In particular, there is a continued need for reduction in transistor size in semiconductor designs.

However, as transistor feature sizes are reduced to smaller and smaller dimensions, external resistance becomes a dominant factor in the device operation, and can severely limit transistor performance. In recent transistor technologies, external resistance may account for more than half of the total device resistance, with external resistance scaling poorly with gate pitch and transistor density scaling, primarily because the physical size/area of a metal semiconductor contact in the source/drain rapidly decreases with the reduction in device size.

BRIEF DESCRIPTION OF THE DRAWINGS

Embodiments described here are illustrated by way of example, and not by way of limitation, in the figures of the accompanying drawings in which like reference numerals refer to similar elements.

DETAILED DESCRIPTION

Embodiments described herein are generally directed to a semiconductor device with released source and drain.

For the purposes of this description:

"Trigate transistor" refers to non-planar transistor having including a channel protruding from a surface in a fin structure, with three sides of the fin being in contact with an overlapping gate. A transistor may be referred to as a FinFET, or Fin Field Effect Transistor.

In semiconductor transistor fabrication, a III-V InGaAs (Indium Gallium Arsenide, wherein indium and gallium are Group III elements and arsenide is a Group V element) transistor is a technology providing advantages for scaling to smaller dimensions. However, for highly scaled transistors that are likely to be implemented in an increasingly tighter gate pitch circuit layouts, including in particular III-V InGaAs transistors, an external resistance bottleneck is highly problematic and can greatly reduce device performance.

In some embodiments, in a dual layer fin structure with subfin oxide isolation, a "wrap-around" released source/drain contact metal structure is provided, the contact metal structure providing a means to alleviate the external resistance problem. In some embodiments, the following elements are provided by an apparatus or process:

(1) An apparatus including an InGaAs fin with sacrificial subfin layer grown in ART (aspect ratio trapping) trench on a silicon substrate.

(2) A semiconductor device including an oxide subfin layer.

(3) A semiconductor including a metal contact wrapping around the source/drain.

In some embodiments, the surface area of the source/drain contact is increased by integrating the wrap-around metal contact. In this manner, a contact area is increased without compromising the gate pitch scaling, and standard ALD/CVD (atomic layer deposition/chemical vapor deposition) metal deposition processes may still be used to form the contact. In some embodiments, external resistance is reduced without the necessity of changing the physical composition of the contact material.

Figure 1:
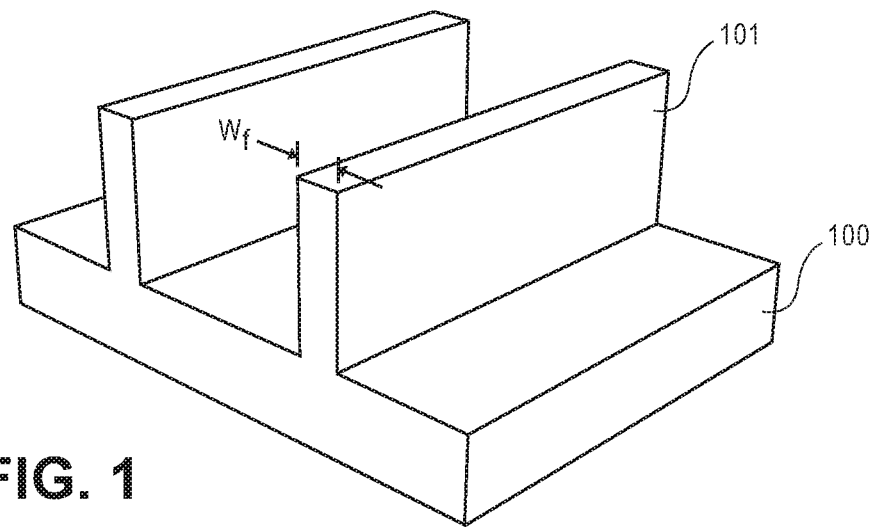
FIG. 1 illustrates a perspective view of a device including a plurality of fins formed on a substrate, according to an embodiment.

FIG. 1 illustrates a perspective view of a device including a plurality of fins formed on a substrate, according to an embodiment. As illustrated in FIG. 1, a substrate 100 with a plurality of fins 101 is illustrated. The number of fins 101 formed on the substrate 100 can be adjusted to an appropriate number, as it is understood to those skilled in the art. In an embodiment, the fins 101 are formed using an etching process. A patterning etch mask is placed on the substrate 100. Thereafter, the substrate 100 is etched and the portions of the substrate protected by the mask form the fins 101. The etch masks are then removed.

In an embodiment, the substrate 100 may be formed of any appropriate material. In an embodiment, the substrate 100 may be a crystalline substrate formed using a bulk silicon or a silicon-on-insulator (SOI) substructure. In other embodiments, the semiconductor substrate 100 may be formed using alternative materials, which may or may not be combined with silicon. Such materials may include, but are not limited to, germanium, indium antimonide, lead telluride, indium arsenide, indium phosphide, gallium arsenide, indium gallium arsenide, gallium antimonide, or other combinations of group III-V or group IV materials. In another embodiment, the substrate 100 comprises a germanium substrate, a germanium-on-insulator substrate (GeOI), or a germanium-on-nothing substrate (GeON). Although a few examples of materials from which the substrate 100 may be formed are described here, any material that may serve as a foundation upon which a semiconductor device may be built may be utilized.

In an embodiment, the fins 101 are formed from the same material as the substrate 100. In an embodiment, the fins 101 are high aspect ratio fins. In an embodiment, the high aspect ratio fins may have a height to width ratio that is 2:1, or greater. An additional embodiment may include fins 101 that have a height to width ratio that is 10:1, or greater. In an embodiment, the width WF of the fins 101 is chosen to have a width that is substantially equal to the desired width of a nanowire channel that will subsequently be formed and explained in greater detail below. By way of example the width WF of the fins 101 may be between 10-20 nm (nanometers).

Figure 2:
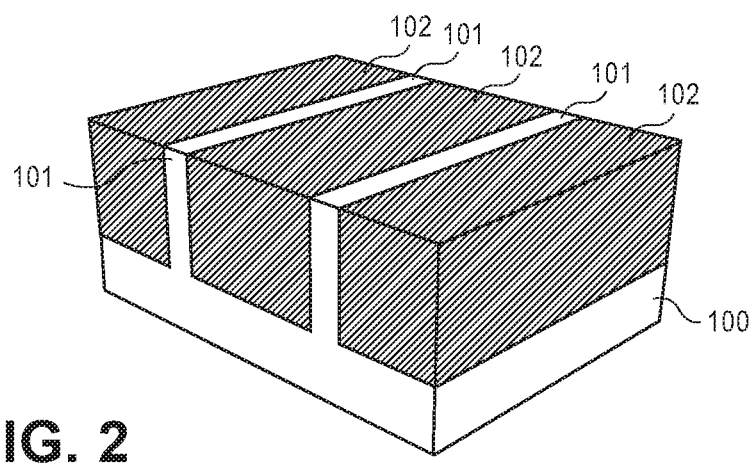
FIG. 2 illustrates a perspective view of a device after a shallow trench isolation (STI) layer is formed on top of the substrate and the fins, according to an embodiment.

FIG. 2 illustrates a perspective view of the device after a shallow trench isolation (STI) layer is formed on top of the substrate and the fins, according to an embodiment. As shown in FIG. 2, a shallow trench isolation (STI) layer 102 may be formed over the top surfaces of the substrate 100 and fins 101. In an embodiment, any appropriate deposition process such as a chemical vapor deposition (CVD) process can be used to deposit a STI layer over the substrate 100 and the fin 101. The STI layer may be deposited to height greater than a top surface of the fins 101. Then, as shown in FIG. 2, the STI layer 102 is planarized to expose the top surface of the fins 101. For example, the STI layer 102 may be planarized with a chemical-mechanical polishing (CMP) operation.

In an embodiment, the STI layer 102 may be formed from any appropriate insulating material. For example, the STI layer 102 may be an oxide, such as a silicon oxide. According to an additional embodiment, the STI layer 102 may include a plurality of dielectric materials. For example, a first dielectric material may be a conformal material and a second dielectric material may be a fill material.

Figure 3:
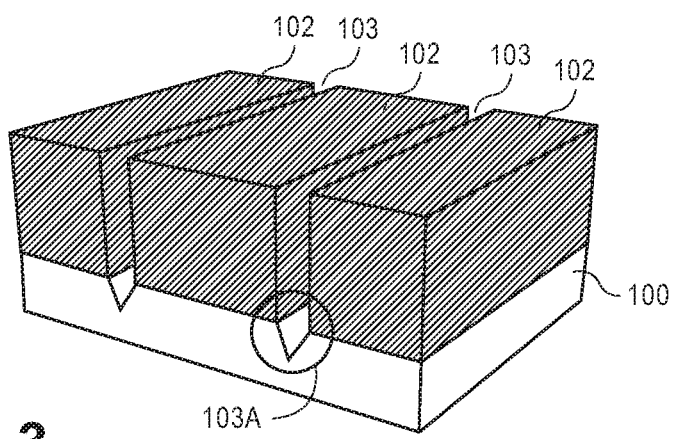
FIG. 3 illustrates a perspective view of a device after the fins are recessed to form trenches, according to an embodiment.

FIG. 3 illustrates a perspective view of the device after the fins are recessed to form trenches, according to an embodiment. As shown in FIG. 3, the fins 101 may be removed to form a trench 103. The fins 101 may be removed by any known etching techniques, including, but not limited to, dry etching, wet etching, or combinations thereof. In an embodiment, the trench 103 is an aspect ratio trapping (ART) trench. As used herein, ART refers generally to the defect trapping technique of causing defects to terminate at non-crystalline, e.g., dielectric sidewalls, where the sidewalls are sufficiently high relative to the size of the growth area so as to trap most, if not all, of the defects. ART utilizes high aspect ratio openings, such as trenches or holes, to trap dislocations, preventing them from reaching the epitaxial surface, and greatly reduces the surface dislocation density within the ART opening.

According to an embodiment, the fins 101 are not entirely removed during the etching operation. In such an embodiment, a residual material of the fin 101 may remain at the bottom of the trench 103. In one embodiment, a bottom portion 103a of trench 103 may have a {111} faceting, which may facilitate the growth of a III-V material. In one embodiment the {111} faceting may be formed by an etching chemistry used during the etching operation that selectively etches the fins 101 along a desired crystallographic plane. In another embodiment the bottom portion 103a of the trench 103 may extend into the substrate 100 either during the removal of the fins 101 or thereafter. In such an embodiment the bottom portion of the trench may have a {111} faceting formed in the substrate 100.

Figure 4:
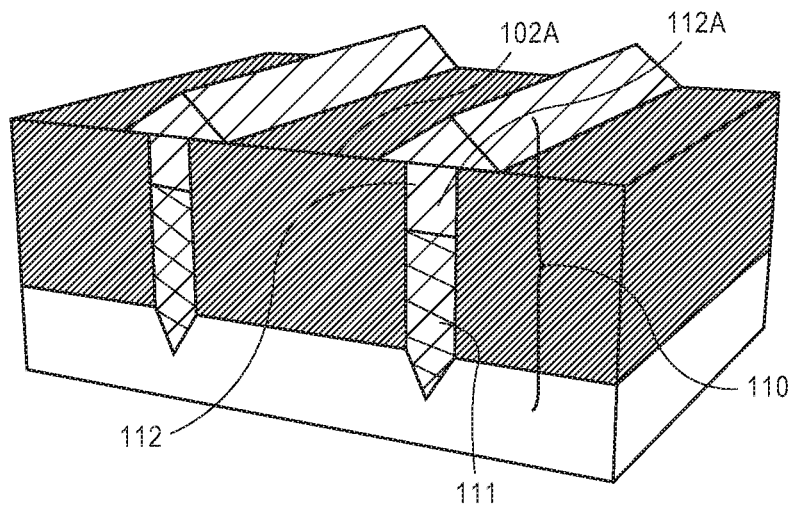
FIG. 4 illustrates a perspective view of a device after multi-layer stacks are formed in the trenches, according to an embodiment.
Figure 9A:
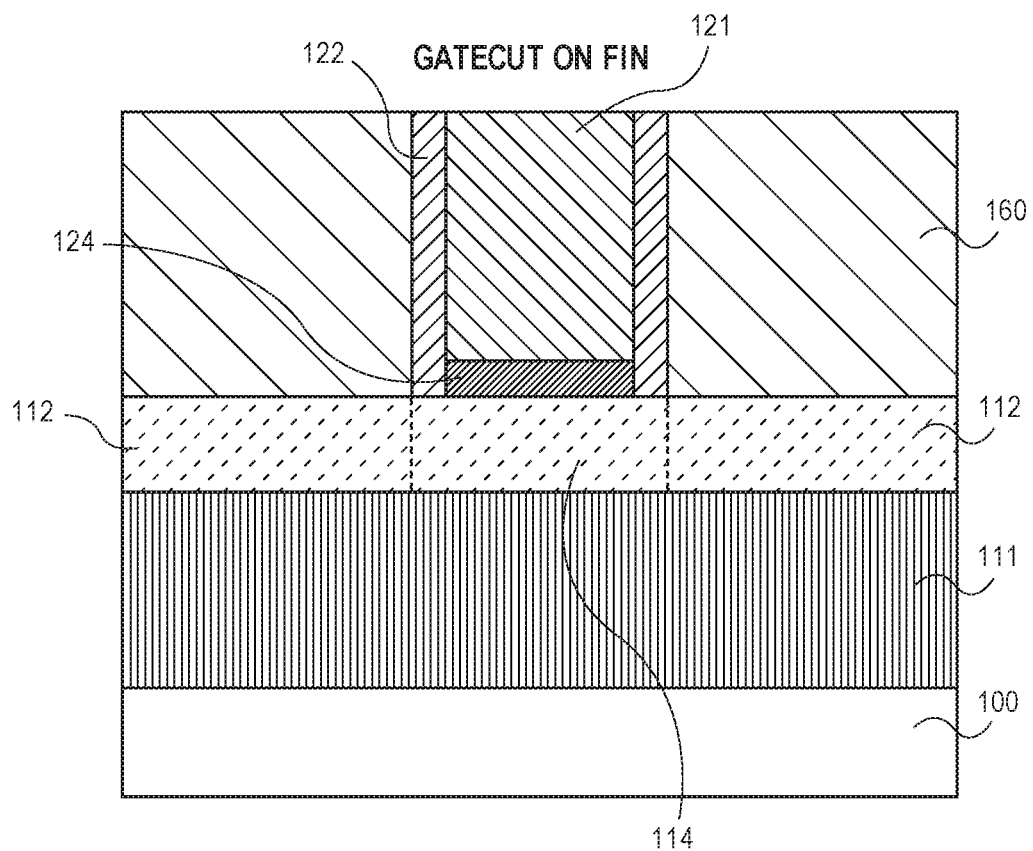
FIGS. 9A-9C illustrate views of a device after dielectric material is applied according to an embodiment.

FIG. 4 illustrates a perspective view of the device after multi-layer stacks are formed in the trenches, according to an embodiment. As shown in FIG. 4, a multi-layer stack 110 is formed in the trench 103. The multi-layer stack 110 includes a plurality of individual layers. In an embodiment, the multi-layer stack 110 includes two distinct layers. The bottom layer of the multi-layer stack 110 is a buffer layer 111. The buffer layer 111 may be formed over the residual material remained on the bottom of the trench 103 explained above. A channel layer may be formed over the buffer layer 111. As shown in FIG. 9A, the channel layer will include a source/drain channel 112 under the source/drain portion of the device and a gate channel 114 under the gate portion, with the source/drain channel portion 112 being visible in FIGS. 4-7. While two layers are illustrated in FIG. 4, it is to be appreciated that more layers may be included in the multi-layer stack 110. For example, the multi-layer stack 110 may further include a seed layer between the substrate 100 and the buffer layer 111. The seed layer may be a base layer for growing the buffer layer. In an embodiment, additional graded buffer layers may be formed between the substrate 100 and the channel layer 112.

Referring back to FIG. 4A, the buffer layer 111 may be epitaxially grown over the bottom portion 103a of trench 103. In an embodiment, the buffer layer 111 is composed of a different material than the residual material in the bottom portion 103a of a trench 103. In an embodiment, the buffer layer 111 may be epitaxially grown by any known formation process including an atomic layer deposition (ALD), metalorganic chemical vapor deposition (MOCVD), or chemical vapor deposition (CVD) processes. In an embodiment, the ART feature of the trench 103 prevents the defect within the buffer layer 111 to reach its surface.

In an embodiment, the buffer layer 111 can be composed of any appropriate material that provides a good etch selectivity with respect to the channel layer 112 and enables pseudomorphic growth of the channel layer 112 as explained below. The buffer layer 111 can be composed of a high band-gap III-V material. For the purpose of the present description, a high band-gap material may be defined to be a material that has a band-gap greater than silicon. Furthermore, the high aspect ratios of the trench 103 may prevent the use of materials that have poor fill characteristics. For example, when a material is deposited in a high aspect ratio trench, the resulting layer may have a significant number of voids and/or other defects. Accordingly, embodiments may include materials for the buffer layer 111 that may be epitaxially grown on the bottom portion 103a of the trench 103 without the formation of a significant number of voids or other defects. For example, the buffer layer 111 may be composed of aluminum indium arsenide (AlInAs), indium phosphide (InP), gallium phosphide (GaP), gallium arsenide (GaAs), gallium arsenide antimonide (GaAsSb), aluminum arsenide antimonide (AlAsSb), indium aluminum gallium arsenide (InAlGaAs), indium aluminum gallium phosphide InGaAlP), aluminum gallium arsenide (AlGaAs), and the like. The buffer layer 111 may be grown to a height greater than half of the depth of the trench 103, for example between 50-150 nm.

In some embodiments, the channel layer 112 may be formed over the top surface of the buffer layer 111. By way of example, the channel layer 112 may be formed with an ALD, MOCVD, CVD, or MBE process. In an embodiment, a top surface 112a of the channel layer 112 is lower than a top surface 102a of the STI layer 102. In one embodiment, the width of the channel layer 112 is confined by the sidewalls of the trench 103. In an embodiment, the width of the channel layer 112 is extended straight and in parallel with the width of the buffer layer 111.

The channel layer 112 preferably has a lattice parameter close to that in the underlying buffer layer 111. The channel layer 112 may be formed by any appropriate material such as a low band-gap III-V epitaxial material. For the purpose of the present description, a low band-gap material may be defined to be a material that has a band-gap less than silicon. For example, the channel layer 112 may be formed by indium gallium arsenide, indium arsenide, indium antimonide, and the like.

In some embodiments, the channel layer 112 is psedumorphically grown over the buffer layer 111. While lattice mismatch in heteroepitaxial systems leads to defect generation in relatively thick epitaxially grown layers, thin strained epitaxial layers can be grown without crystal defects even when grown on grossly lattice mismatched substrates, such growth is referred to as pseudomorphic growth. Avoidance of crystal defects is achieved by imposing a thickness limitation on the epitaxial layers known as critical thickness. As such, the channel layer 112 may be grown to a thickness TC less than its critical thickness. For example, although the lattice constant of Indium gallium arsenide (InGaAs) is larger than that of Gallium arsenide (GaAs), it is possible to epitaxially grow a high quality InGaAs layer on a GaAs substrate by pseudomorphic growth, i.e., by compulsorily matching the lattice constant of the InGaAs layer in a direction parallel to the surface of the GaAs substrate with the lattice constant of the GaAs substrate, as long as the InGaAs layer is thinner than the critical thickness at which dislocations start to occur due to lattice mismatch.

The critical thickness of the channel layer 112 depends on the lattice mismatch between the buffer layer 111 and the channel layer 112. Generally, greater the difference between the two lattice constants, the smaller the critical thickness of the channel layer. Typically, a mismatch of about 1-5% requires a critical thickness of about 1-100 nm. For example, in an embodiment, the buffer layer 111 is formed of GaAs and the channel layer is formed of InGaAs with lattice mismatch of 4% while the channel layer has a thickness of 10-12 nm.

Figure 5:
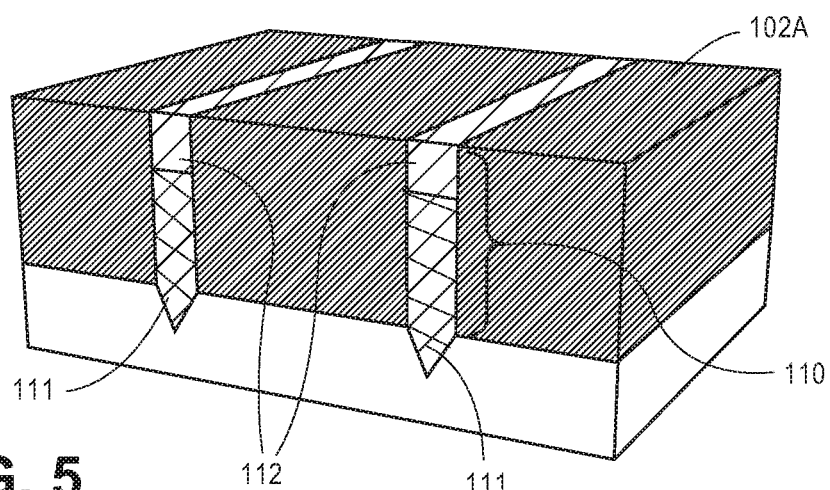
FIG. 5 illustrates a perspective view of a device after a cap layer is polished to the same height as the STI layer, according to an embodiment.

FIG. 5 illustrates a perspective view of the device after a channel layer is polished to the same height as the STI layer, according to an embodiment.

Referring to FIG. 5, an embodiment may include a planarization. The planarization process may remove any overgrowth of the channel layer 112 that has extended out of the trench 103 and above the top surface 102a of the STI layer 102. For example, top surfaces of the cap layer 113 and the STI layer 102 may be planarized with a CMP process.

Figure 6:
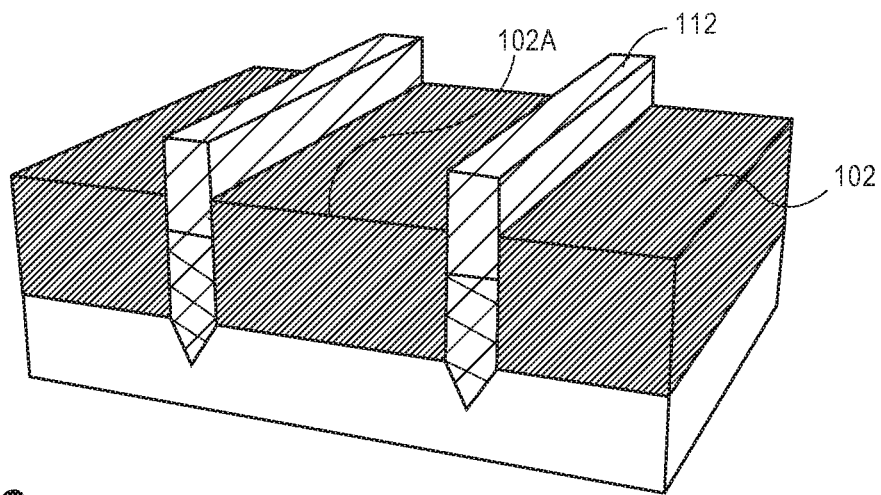
FIG. 6 illustrates a perspective view of a device after the STI layer is recessed to expose the channel layer within the multi-layer stacks, according to an embodiment.

FIG. 6 illustrates a perspective view of the device after the STI layer is recessed to expose the channel layer within the multi-layer stacks, according to an embodiment. Referring to FIG. 6, the STI layer 102 may be recessed. In an embodiment, an etching process is used to recess the STI layer 102 without etching the channel layer 112. As such, at least a portion of the channel layer 112 extends above the top surface 102a of the STI layer 102.

Figure 7:
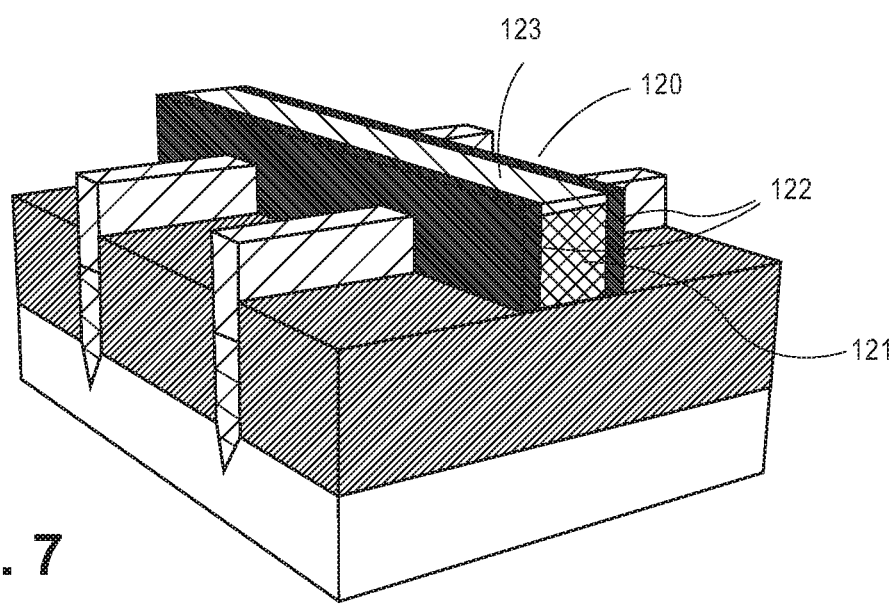
FIG. 7 illustrates a perspective view of a device after a sacrificial gate electrode and sidewall spacers are formed over the cap layer and the STI layer, according to an embodiment.

FIG. 7 illustrates a perspective view of the device after a sacrificial gate electrode and sidewall spacers are formed over the cap layer and the STI layer, according to an embodiment. Referring to FIG. 7, a gate 120 is formed over center portions of the channel layer 112 and the STI layer 102. The gate 120 is extended perpendicular to the channel layer 112. The gate 120 is fabricated by initially forming a sacrificial gate electrode 121 over a center portion of the channel layer 112 that extends above the top surface 102a and a portion of the STI layer. A layer of the material used to form the sacrificial gate electrode 121 may be blanket deposited over the exposed surfaces and patterned to form the sacrificial gate electrode 121. The sacrificial gate electrode 121 may be formed by any appropriate material including one of polysilicon, germanium, silicon germanium, silicon nitride, silicon oxide, or a combination thereof. In an embodiment, a hard mask 123 is formed on top of the sacrificial gate electrode 121. In an embodiment, the hard mask 123 protects the sacrificial gate electrode 121 from being exposed during the proceeding processes.

Referring to FIG. 7, a pair of sidewall spacers 122 may be formed on opposite sidewalls of sacrificial gate electrode 121. The region between the two sidewall spacers 122 is referred to as the gate region herein. The pair of sidewall spacers 122 may be formed using conventional methods of forming sidewall spacers known in the art. In an embodiment, a conformal dielectric spacer layer, such as, but not limited to, silicon oxide, silicon nitride, silicon oxynitride and combinations thereof, is first blanket deposited on all structures, including the channel layer 112 and sacrificial gate electrode 121. The dielectric spacer layer may be deposited using conventional CVD methods such as low pressure chemical vapor deposition (LPCVD), plasma enhanced chemical vapor deposition (PECVD), and atomic layer deposition (ALD). In an embodiment, the dielectric spacer layer is deposited to a thickness of between approximately 2 and 10 nm. Thereafter, a commonly known spacer-etching process may be used to remove the excess dielectric material and leave behind the sidewall spacers 122. In an embodiment, the hard mask 123 and the sidewall spacers 122 completely encapsulate the sacrificial gate electrode 121.

Figure 8:
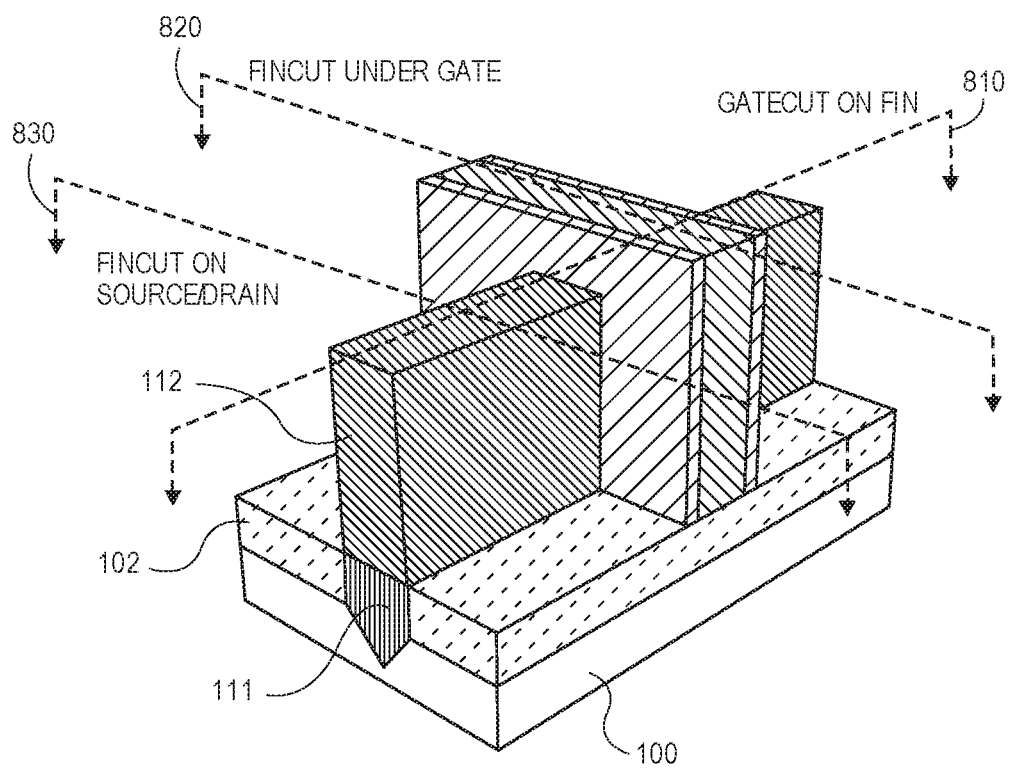
FIG. 8 is an illustration of a semiconductor device according to an embodiment.

FIG. 8 is an illustration of a semiconductor device according to an embodiment. To illustrate the changes in the transistor structure at critical process points, as illustrated in FIGS. 9A through 15C three different views of the transistor are shown, with such views being shown in FIG. 8. The views are representing Gatecut on Fin 810, Fincut Under Gate 820, and Fincut on Source/Drain 830.

FIG. 8 and the following figures generally illustrate a trigate transistor in which the gate portion is gated on three sides. However, embodiments are not limited to a trigate transistor. In some embodiments, embodiments may also include a nanowire semiconductor device in which the nanowire is gated on all sides.

Figure 9B:
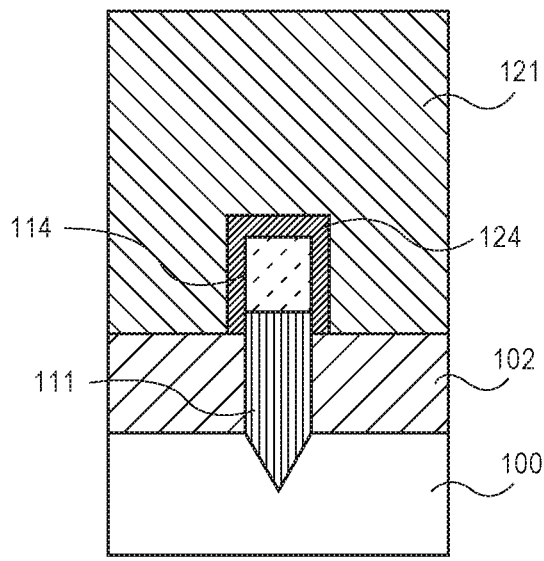
Figure 9C:
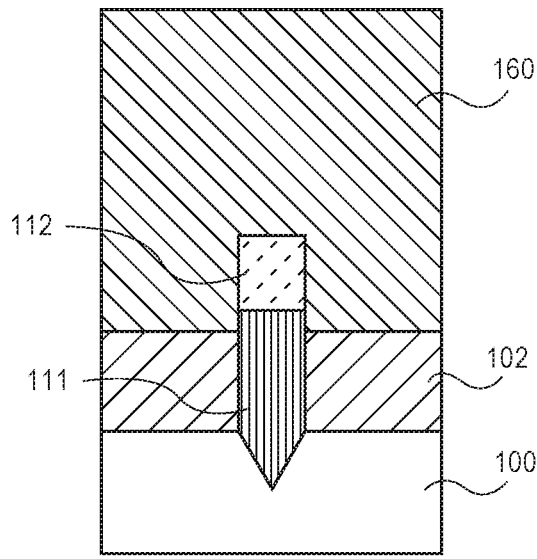

FIGS. 9A-9C illustrate views of a device after dielectric material is applied according to an embodiment. As illustrated in FIG. 9A, the sacrificial gate electrode 121 is present between the sidewall spacers 122 and above a dummy oxide layer 124. In some embodiments, following gate and spacer patterning, an ILD (Inter Layer Dielectric) layer, which may specifically be an ILD0 (void-free Inter Layer Dielectric) 160, is deposited and then planarized using CMP (Chemical Mechanical Planarization) to open up dummy poly gate. By way of example, the ILD0 layer 160 may be deposited using a conventional technique, such as CVD. In an embodiment, ILD0 layer 160 may be any dielectric material such as, but not limited to undoped silicon oxide, doped silicon oxide (e.g., BPSG, PSG), silicon nitride, and silicon oxynitride. After the ILD0 layer 160 is deposited, any overburden may then be polished back using a conventional chemical mechanical planarization method to expose a top surface of the sacrificial gate electrode 121 and top surfaces of the pair of sidewall spacers 122 as shown in FIG. 9A.

As shown in FIG. 9A, the channel layer includes a source/drain channel 112 under the source/drain portion and a gate channel 114 under the gate portion.

Figure 10A:
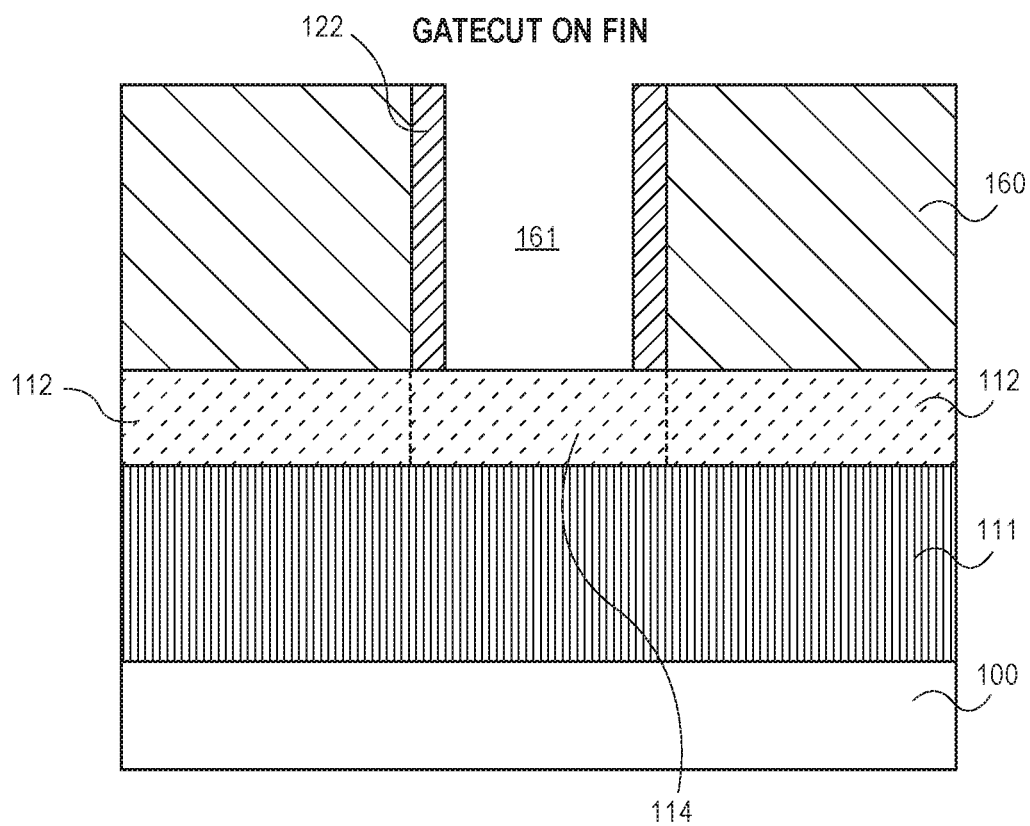
FIG. 10A-10C illustrate views of a device following removal of the sacrificial gate electrode and dummy oxide according to an embodiment.
Figure 10B:
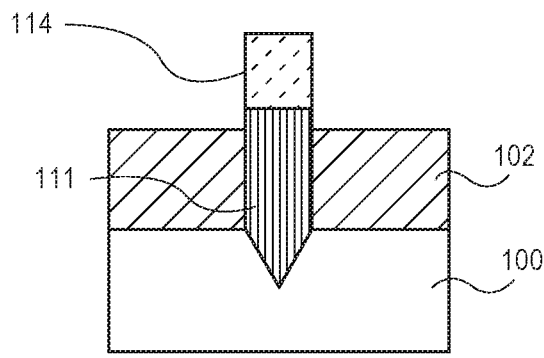
Figure 10C:
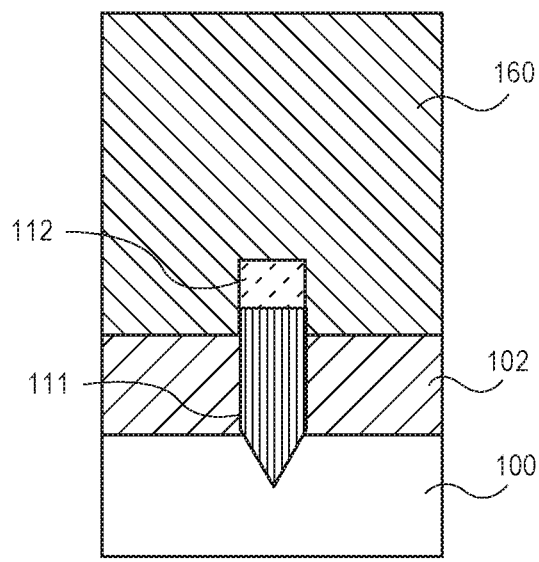

FIGS. 10A-10C illustrate views of a device following removal of the sacrificial gate electrode and dummy oxide according to an embodiment. In some embodiments, the sacrificial gate electrode 121 and the dummy oxide layer 124, as illustrated in FIG. 9A, are removed to form gate cavity 161. In some embodiments, the removal of the sacrificial gate electrode 121 and the dummy oxide layer 124 leaves the exposed InGaAs 112/GaAs 111 fin within the gate cavity, as illustrated in FIG. 10B providing the Fincut Under Gate view.

Figure 11A:
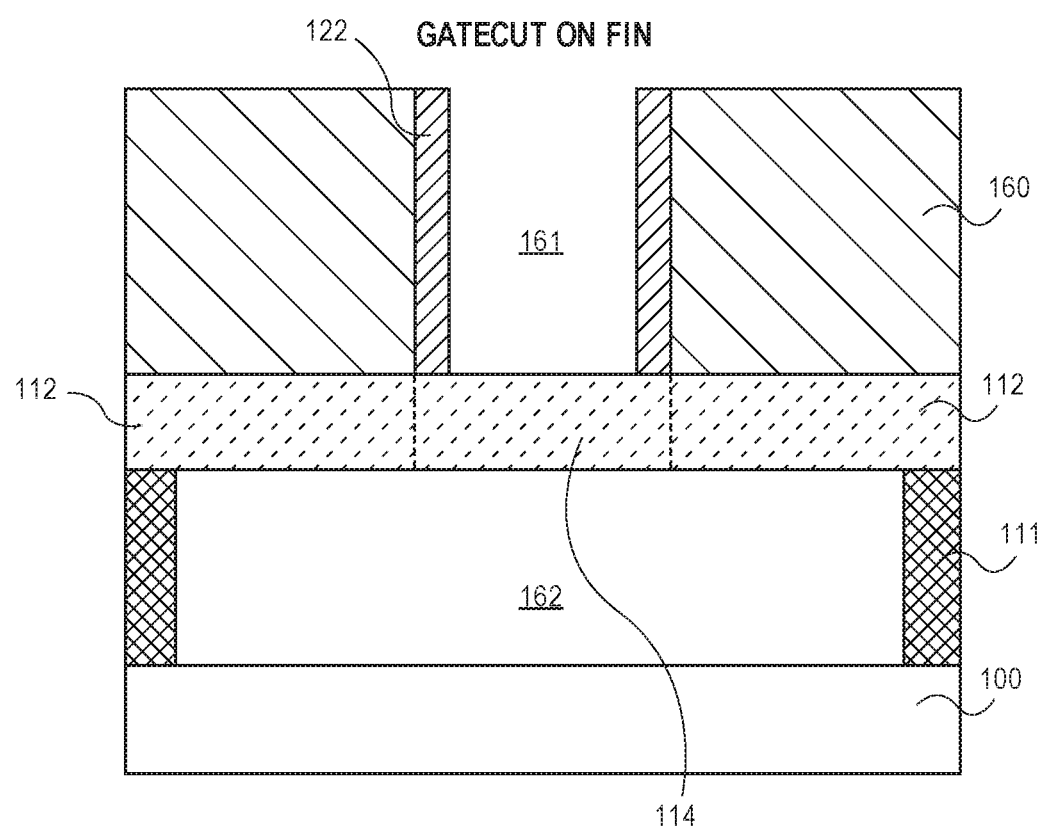
FIGS. 11A-11C illustrate views of a device following etching of the subfin layer.
Figure 11B:
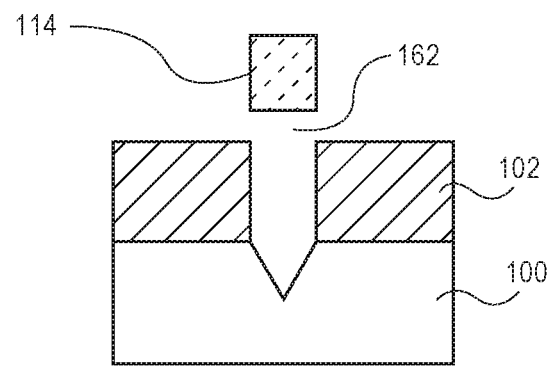
Figure 11C:
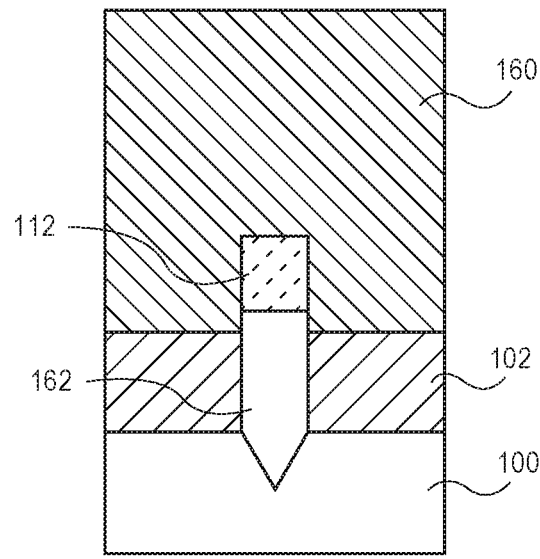

FIGS. 11A-11C illustrate views of a device following etching of the subfin layer. In some embodiments, the subfin GaAs buffer layer 111 is etched out using a selective etch. In some embodiments, the etching out of the GaAs layer 111 results in creation of a gate trench 162 under the gate channel extending all the way to the source and drain. In some embodiments, the etching is performed generally in the proximity of the gate of the device.

Figure 12A:
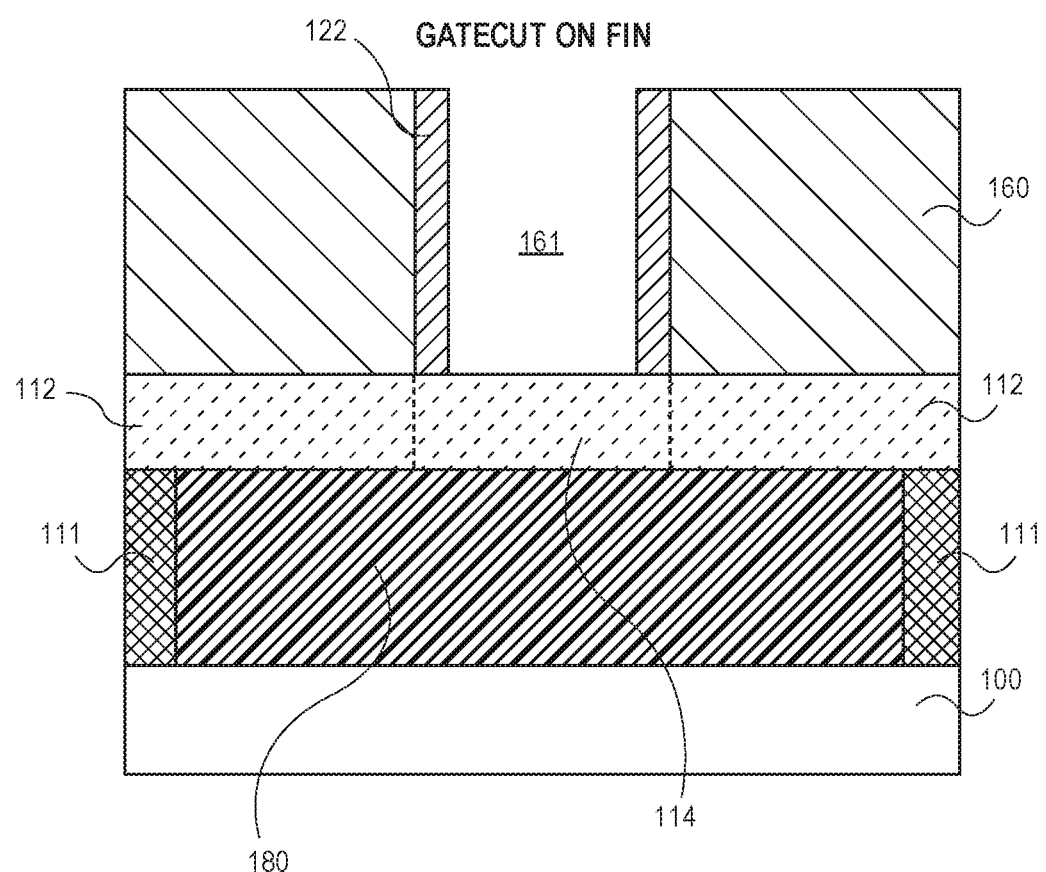
FIGS. 12A-12C illustrate views of a device with a subfin oxide layer according to an embodiment.
Figure 12B:
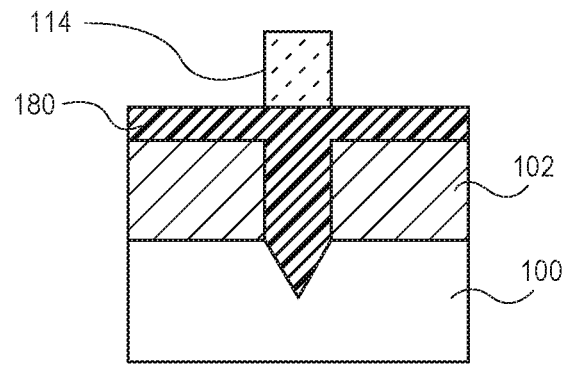
Figure 12C:
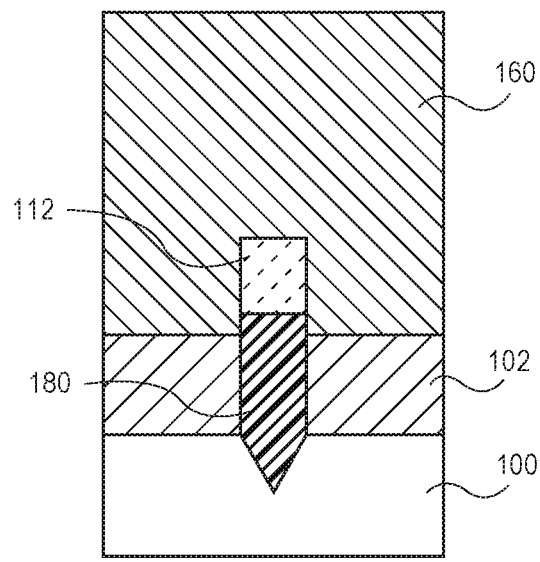

FIGS. 12A-12C illustrate views of a device with a subfin oxide layer according to an embodiment. In some embodiments, the gate drench 162 below the gate channel 114, as illustrated in FIG. 11A, is filled back with oxide 180 to create a localized subfin oxide isolation layer. In some embodiments, a reflow oxide deposition process is applied to fill this cavity thru the opening inside the gate trench. In some embodiments, the oxide 180 may fill up the entire gate trench. In some embodiments, an oxide etch process is then used to recess the oxide down to the bottom of the InGaAs channel.

Figure 13A:
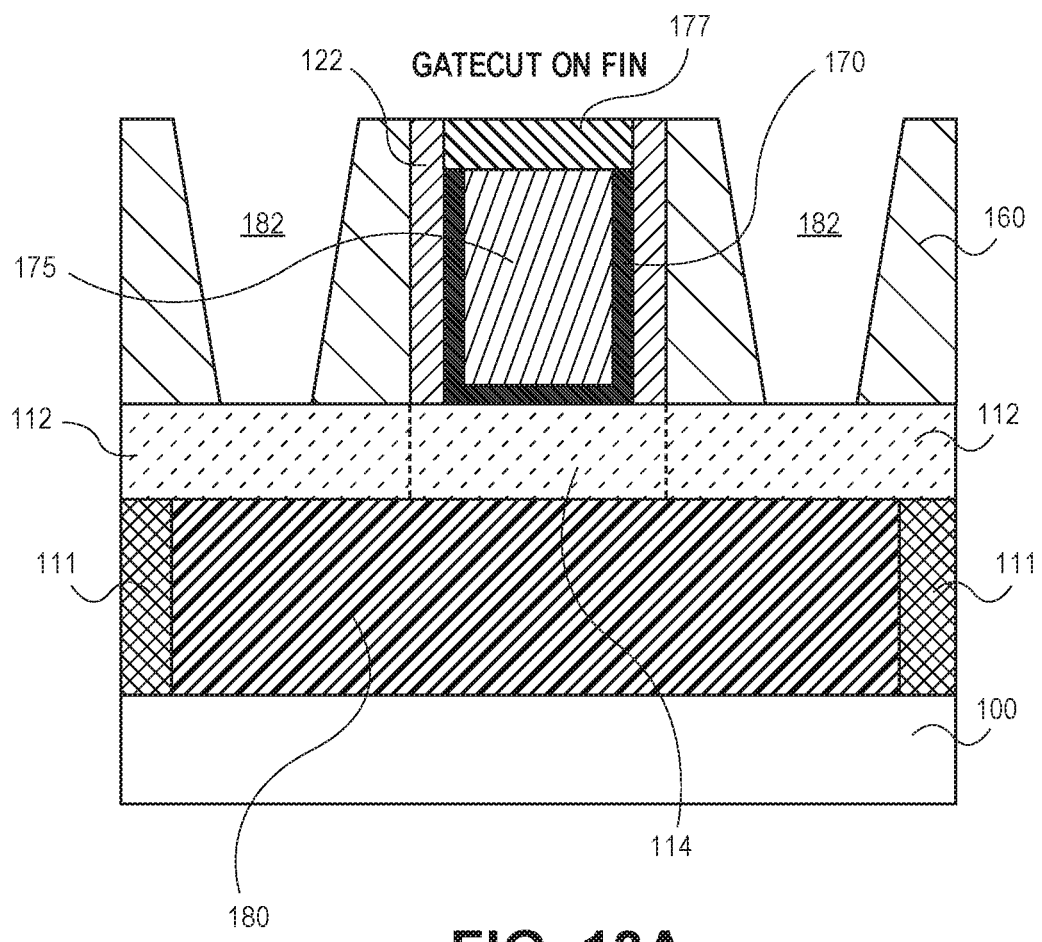
FIGS. 13A-13C illustrate views of a device with a gate electrode and source and drain trenches according to an embodiment.
Figure 13B:
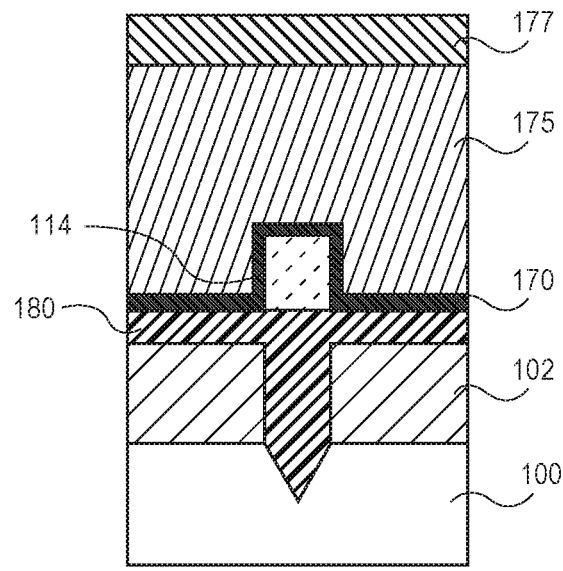
Figure 13C:
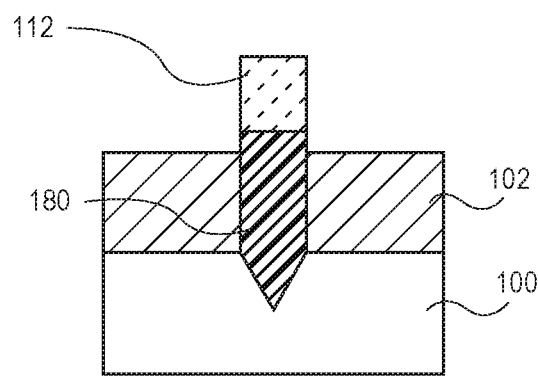

FIGS. 13A-13C illustrate views of a device with a gate electrode and source and drain trenches according to an embodiment. In some embodiments, a high-K dielectric material liner 170 and a metal gate 175 are deposited in the gate cavity 161 and planarized to form the metal gate. This process may be followed with a standard dielectric gate cap 177 formation. The specific illustration in FIG. 13A-13C is a trigate device, with gating on three sides. However, in other embodiments a nanowire device may alternatively be gated on all sides.

In some embodiments, the oxide in the source/drain region of the device is then etched using a highly anisotropic plasma etch to form the source/drain contact trenches 182.

Figure 14A:
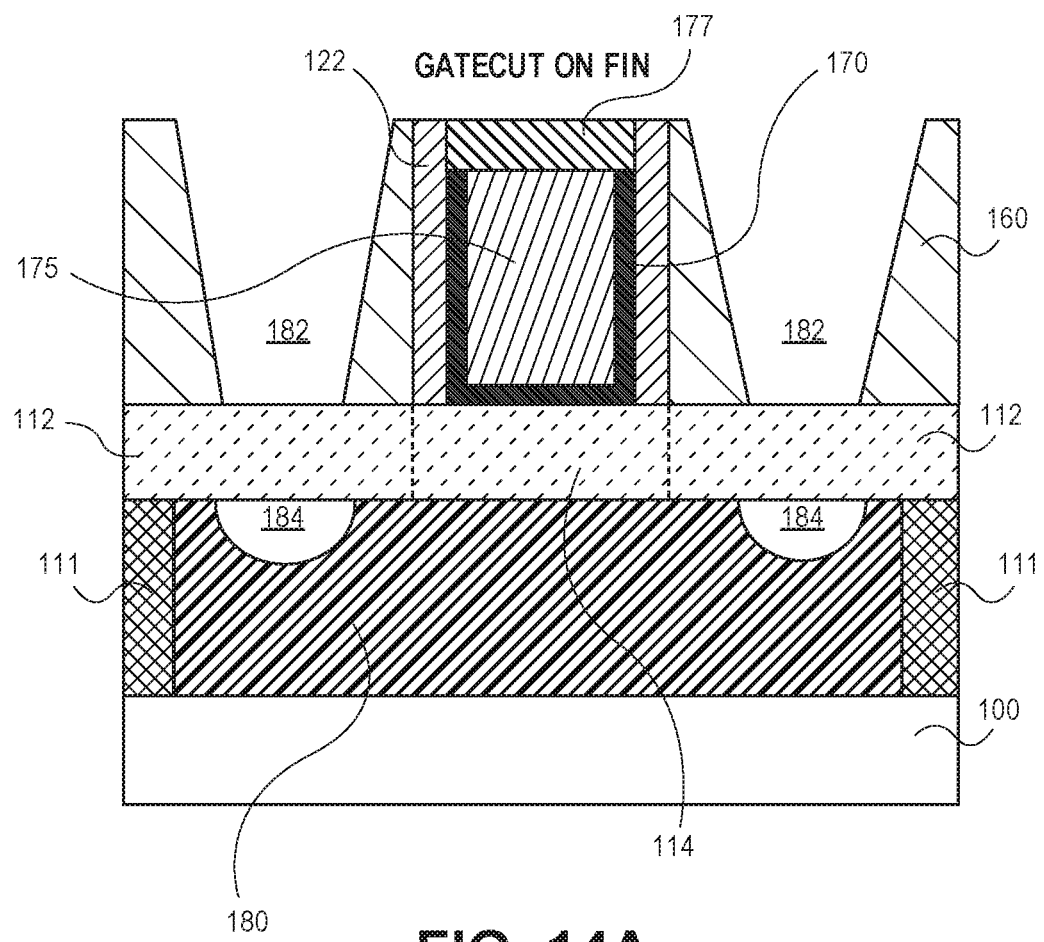
FIGS. 14A-14C illustrate views of a device with subfin cavities according to an embodiment.
Figure 14B:
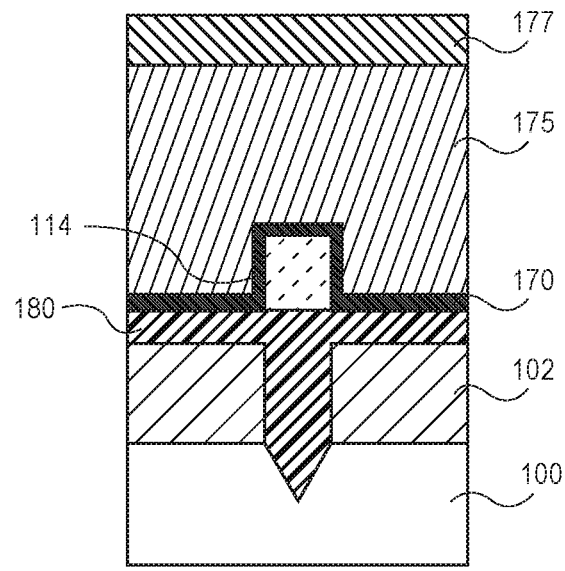
Figure 14C:
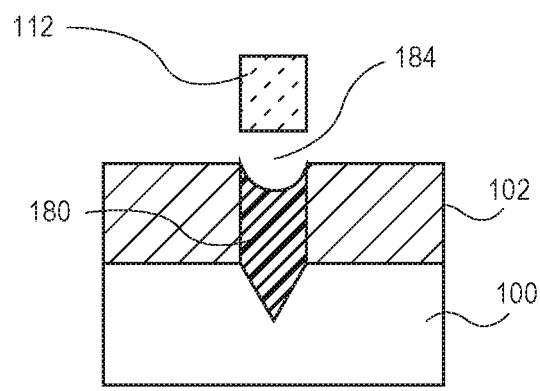

FIGS. 14A-14C illustrate views of a device with subfin cavities according to an embodiment. In some embodiments, using an isotropic oxide etch, such as dilute HF (Hydrofluoric Acid), or a dry etch, the subfin oxide layer 182 inside the source/drain contact trenches 182 is etched out to create cavity 184 under the InGaAs source drain channel 112. In some embodiments, the isotropic or dry etch is to etch under the trenches 182 to create the cavities 184, wherein the process results in a structure in which all sides of the InGaAs source/drain channel 112 are exposed, which is visible in the fincut on source/drain view provided in FIG. 14C.

Figure 15A:
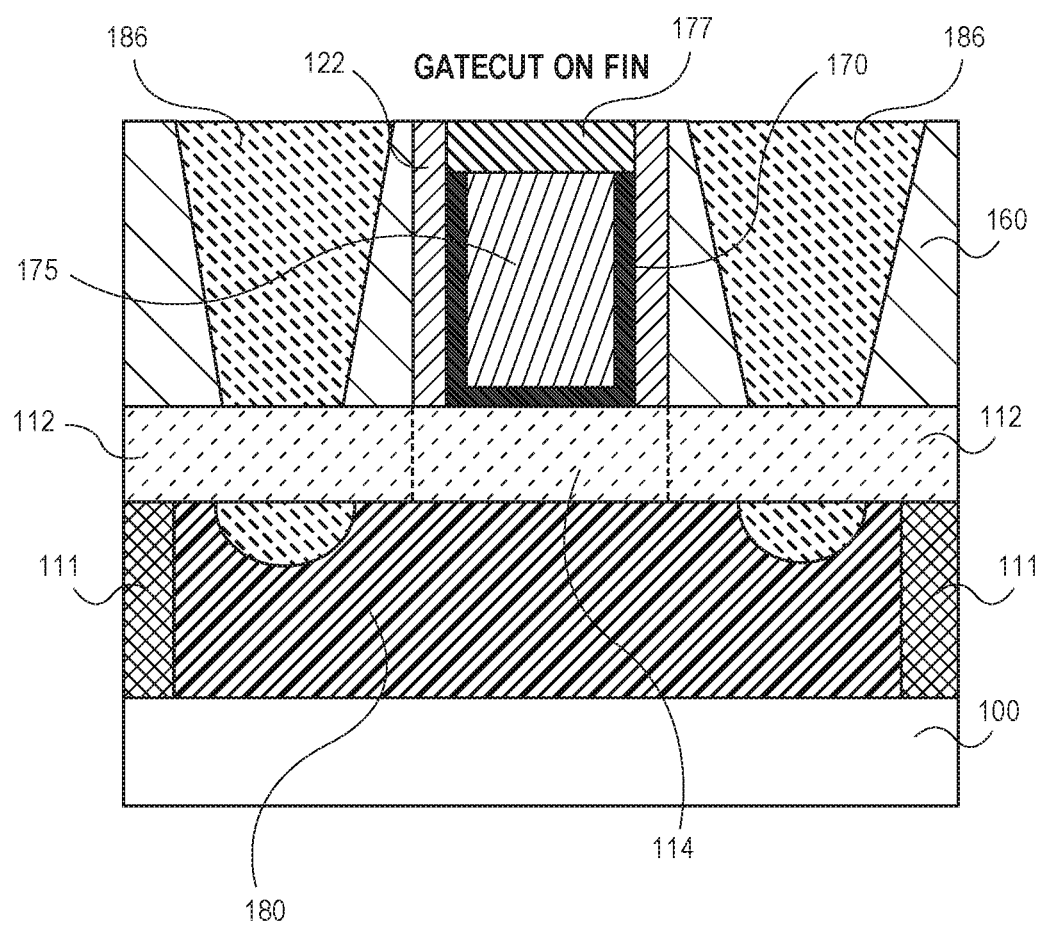
FIG. 15A-15C illustrate views of a device with released source and drain, according to an embodiment.
Figure 15B:
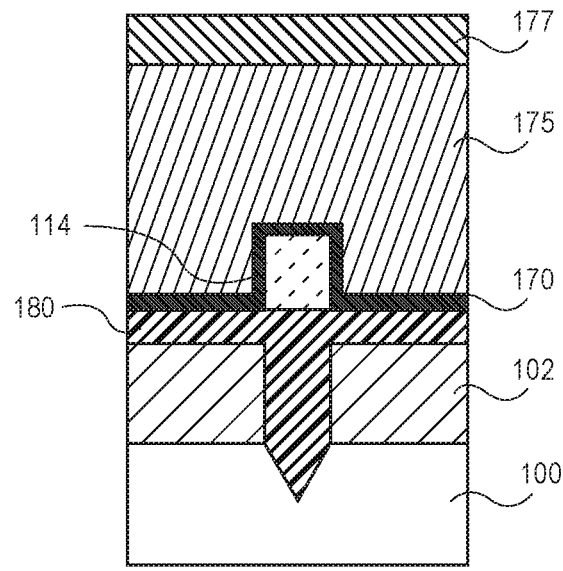
Figure 15C:
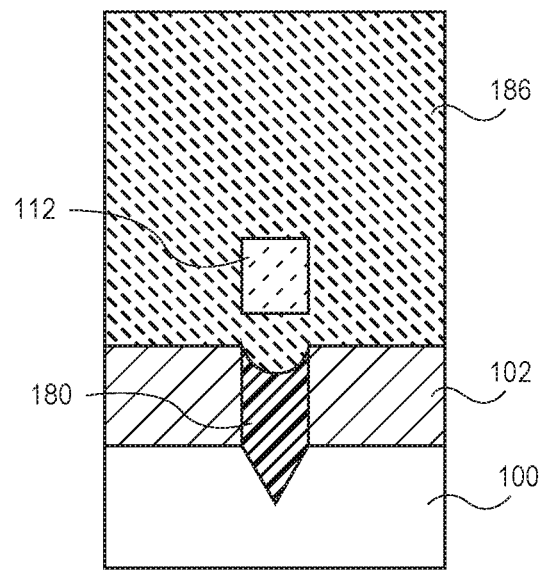

FIGS. 15A-15C illustrate views of a device with released source/drain structure according to an embodiment. In some embodiments, contact metal 186 is then deposited into the source/drain contact trenches 182-184, as illustrated in FIG. 14A.

In some embodiments, the deposit of the contact material 186 is to form a complete wrap-around contact structure for the InGaAs source/drain channel 112, thereby providing contact with all sides of the drain channel. In contrast, a conventional process would be limited to a volume above the source/drain, and thus only the top side of the source/drain channel would be contacted by the contact metal. The wrap-around contact provided by the contact metal 186 around the source/drain channel 112 is visible in FIG. 15C.

In some embodiments, devices are fabricated with the released source/drain to address the external resistance problem for highly scaled semiconductor devices by increasing a contact area with the source/drain. In some embodiments, the implementation of the released source/drain enables the further scaling of transistor size without requiring changes in the material properties of the transistor. For example, a device may be fabricated with, of example, a same contact metal material while providing a significant reduction in external resistance through the increased contact area within the device.

In some embodiments, a method for fabricating a semiconductor device includes applying a sacrificial gate electrode and oxide layer over a portion of a channel layer to form a gate region, the channel layer being above a buffer layer on a substrate; forming an interlayer dielectric (ILD) layer over portions of the channel layer that are not within the gate region; removing the sacrificial gate electrode and oxide layer to form a gate cavity; etching the buffer layer to form a gate trench; filling the gate trench with an oxide material to form an oxide isolation layer; etching one or more source/drain contact trenches in the ILD; etching the oxide isolation layer below the one or more source/drain contact trenches to form one or more cavities under the source/drain channel, wherein the etching of each contact trench is to expose all sides of the source/drain channel; and depositing contact metal in the one or more source/drain contact trenches, including depositing the contact metal in the one or more cavities under the source/drain channel, thereby producing a wrap-around contact that contacts all sides of the source/drain channel.

Figure 16A:
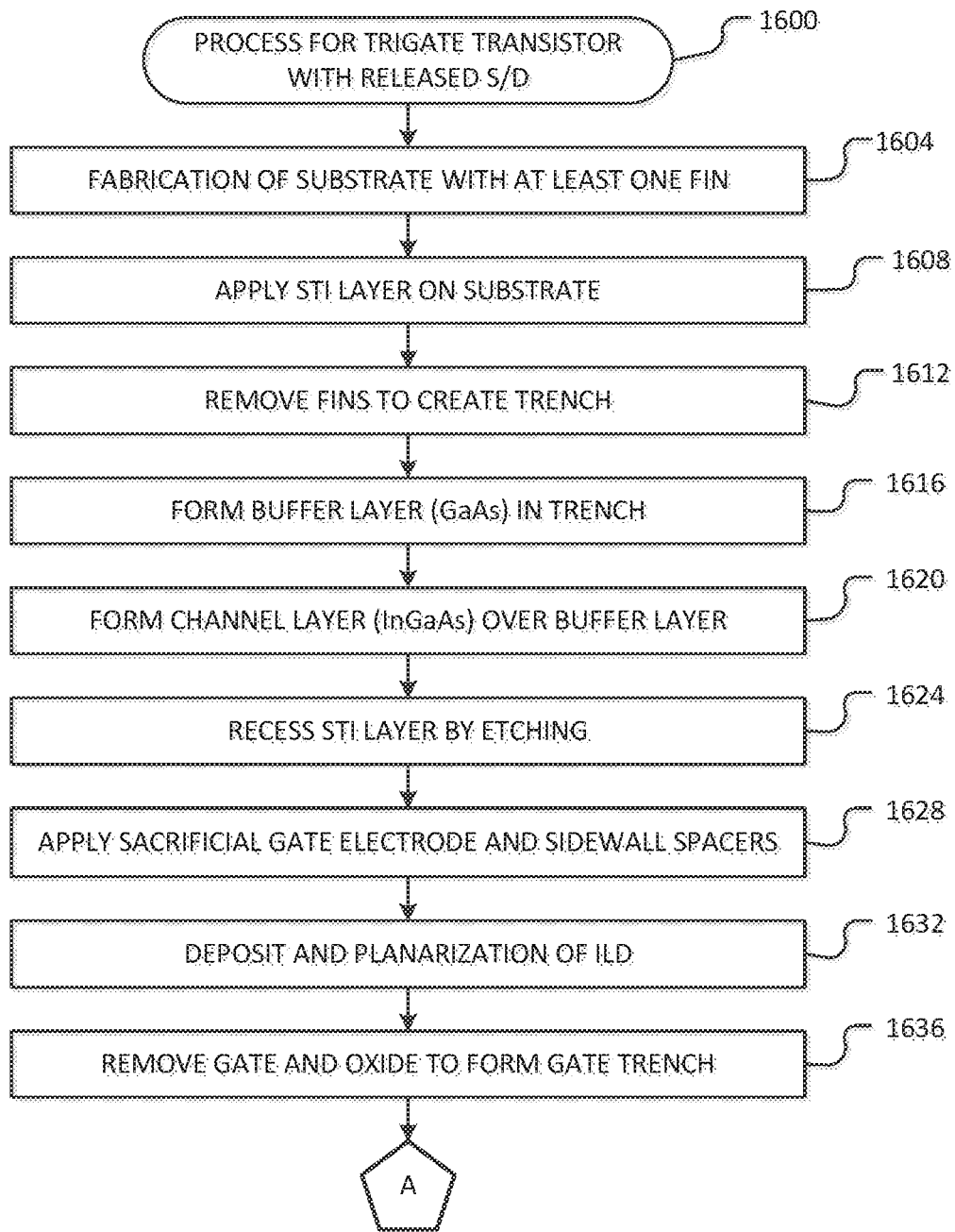
FIGS. 16A and 16B are flowcharts to illustrate a process for fabrication of a semiconductor device with released source/drain according to an embodiment.
Figure 16B:
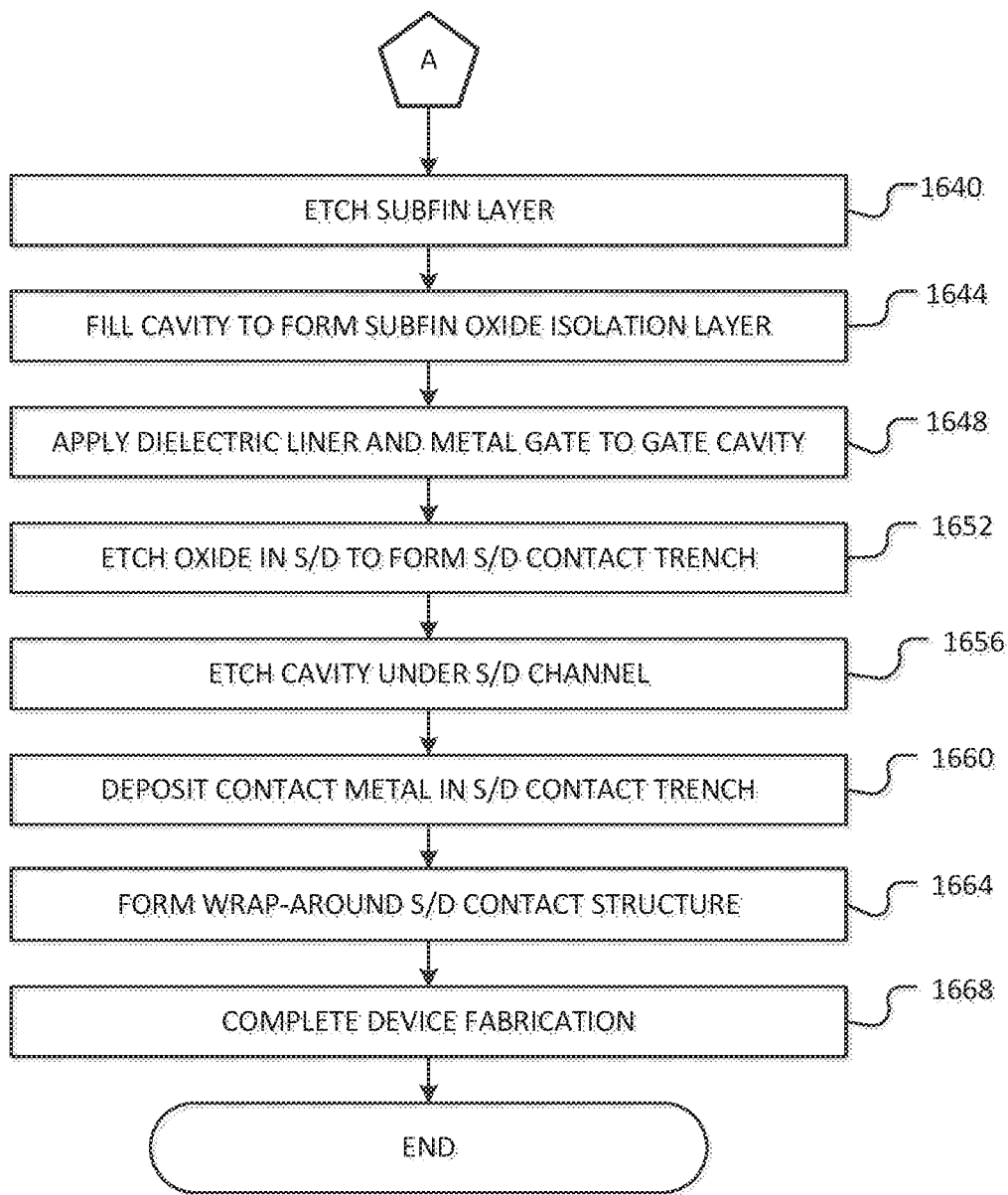

FIGS. 16A and 16B are flowcharts to illustrate a process for fabrication of a semiconductor device with released source/drain according to an embodiment. In some embodiments, a process 1600 may include, but is not limited to, the following:

1604: Fabrication of substrate with at least one fin, such as illustrated in FIG. 1.

1608: Application of STI layer on substrate and fins, such as illustrated in FIG. 2.

1612: Removal of fins to form trench, such as illustrated in FIG. 3.

1616: Form buffer layer (such as GaAs) in trench, such as illustrated in FIG. 4.

1620: Form channel layer (such as InGaAs) in trench, such as illustrated in FIG. 4. In some embodiments, the channel layer will include a source/drain channel under the source/drain portion and a gate channel under the gate portion.

1624: Recess the STI layer using, for example, an etching process, such as illustrated in FIG. 6.

1628: Application of sacrificial gate electrode and sidewall spacers, such as illustrated in FIG. 7.

1632: Deposit and planarization of ILD material, such as illustrated in FIGS. 9A to 9C.

1636: Removal of sacrificial gate electrode and oxide layer, such as illustrated in FIGS. 10A to 10C.

1640: Etch subfin layer using a selective etch, such as illustrated in FIG. 11A to 11C.

1644: Fill cavity to form subfin oxide isolation layer, such as illustrated in FIGS. 12A to 12C.

1648: Apply dielectric liner and metal gate to gate cavity, such as illustrated in FIGS. 13A to 13C.

1652: Etch oxide in source/drain to form source/drain contact trench, such as illustrated in FIGS. 13A to 13C.

1656: Etch cavity under source/drain channel layer, such as illustrated in FIGS. 14A to 14C.

1660: Deposit contact metal in source/drain contact trench, such as illustrated in FIGS. 15A to 15C.

1664: Form wrap-around contract structure for the InGaAs source/drain channel layer by the deposit of the contract metal to provide contact with all sides of the source/drain channel, thereby reducing external resistance for the semiconductor device, such as illustrated in FIGS. 15A to 15C.

1668: Complete any additional processes in the fabrication process for the semiconductor device.

Figure 17:
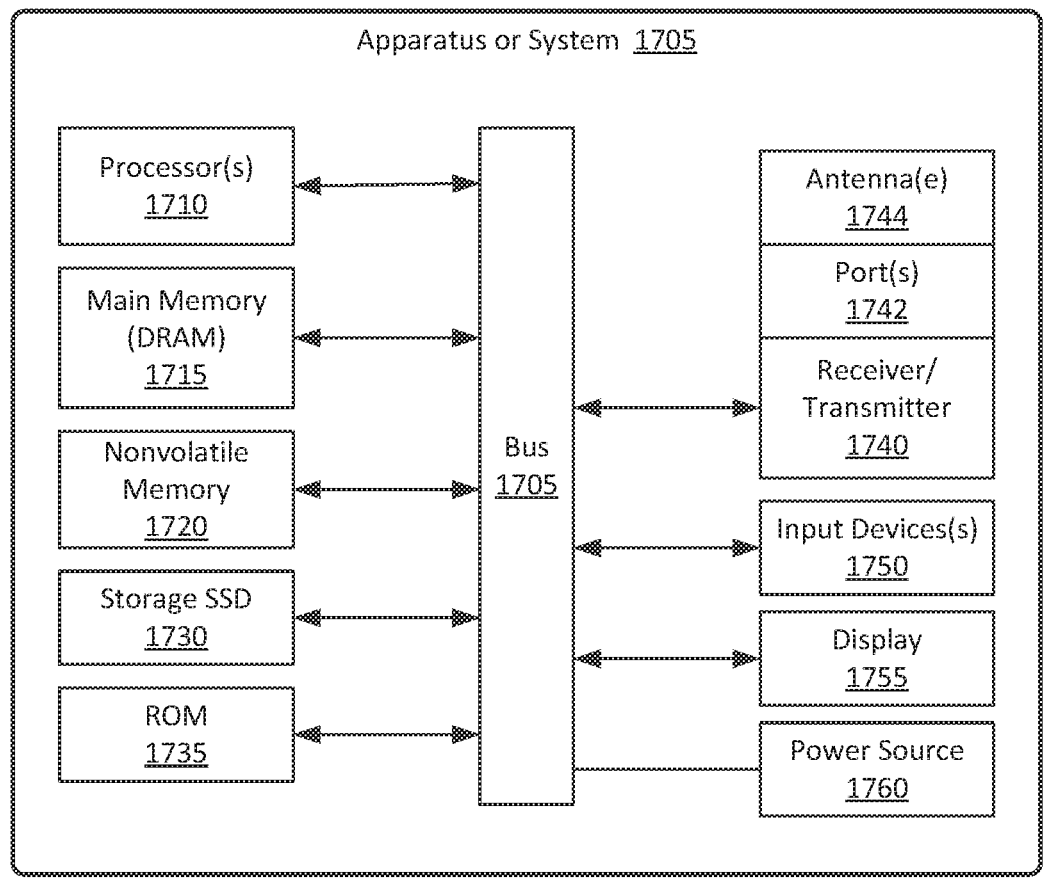
FIG. 17 is an illustration of an embodiment of an apparatus or system including semiconductor elements according to an embodiment.

FIG. 17 is an illustration of an embodiment of an apparatus or system including one or more semiconductor devices with released source/drain according to an embodiment. In this illustration, certain standard and well-known components that are not germane to the present description are not shown. Elements shown as separate elements may be combined, including, for example, an SoC (System on Chip) combining multiple elements on a single chip. In some embodiments, the elements may include one or more semiconductor devices with released source and drain, such as illustrated in FIGS. 1 through 15C. In some embodiments, one or more semiconductor devices are fabricated according to the process illustrated in FIGS. 16A and 16B.

In some embodiments, an apparatus or system 1700 may include a processing means such as one or more processors 1710 coupled to one or more buses or interconnects, shown in general as bus 1705. The processors 1710 may comprise one or more physical processors and one or more logical processors. In some embodiments, the processors may include one or more general-purpose processors or special-processor processors.

The bus 1705 is a communication means for transmission of data. The bus 1705 is illustrated as a single bus for simplicity, but may represent multiple different interconnects or buses and the component connections to such interconnects or buses may vary. The bus 1705 shown in FIG. 17 is an abstraction that represents any one or more separate physical buses, point-to-point connections, or both connected by appropriate bridges, adapters, or controllers.

In some embodiments, the apparatus or system 1700 further comprises a random access memory (RAM) or other dynamic storage device or element as a main memory 1715 for storing information and instructions to be executed by the processors 1710. Main memory 1715 may include, but is not limited to, dynamic random access memory (DRAM).

The apparatus or system 1700 also may comprise a non-volatile memory 1720; a storage device such as a solid state drive (SSD) 1730; and a read only memory (ROM) 1735 or other static storage device for storing static information and instructions for the processors 1710.

In some embodiments, the apparatus or system 1700 includes one or more transmitters or receivers 1740 coupled to the bus 1705. In some embodiments, the apparatus or system 1700 may include one or more antennae 1744, such as dipole or monopole antennae, for the transmission and reception of data via wireless communication using a wireless transmitter, receiver, or both, and one or more ports 1742 for the transmission and reception of data via wired communications. Wireless communication includes, but is not limited to, Wi-Fi, Bluetooth™, near field communication, and other wireless communication standards.

In some embodiments, apparatus or system 1700 includes one or more input devices 1750 for the input of data, including hard and soft buttons, a joy stick, a mouse or other pointing device, a keyboard, voice command system, or gesture recognition system.

In some embodiments, the apparatus or system 1700 includes an output display 1755, where the display 1755 may include a liquid crystal display (LCD) or any other display technology, for displaying information or content to a user. In some environments, the display 1755 may include a touch-screen that is also utilized as at least a part of an input device 1750. Output display 1755 may further include audio output, including one or more speakers, audio output jacks, or other audio, and other output to the user.

The apparatus or system 1700 may also comprise a battery or other power source 1760, which may include a solar cell, a fuel cell, a charged capacitor, near field inductive coupling, or other system or device for providing or generating power in the apparatus or system 1700. The power provided by the power source 1760 may be distributed as required to elements of the apparatus or system 1700.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, read-only memory (ROM), random access memory (RAM), erasable programmable read-only memory (EPROM), electrically-erasable programmable read-only memory (EEPROM), magnetic or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

In some embodiments, a method for fabricating a semiconductor device includes etching a buffer layer of a semiconductor device to form a gate trench under a gate channel portion of a channel layer of the semiconductor device; filling the gate trench with an oxide material to form an oxide isolation layer; etching one or more source/drain contact trenches in an interlayer dielectric (ILD) layer for source and drain regions of the semiconductor device; etching the oxide isolation layer within the one or more source/drain contact trenches to form one or more cavities under a source/drain channel in the source and drain regions, wherein the etching of each source/drain contact trench is to expose all sides of the source/drain channel; and depositing contact metal in the one or more source/drain contact trenches, including depositing the contact metal in the one or more cavities under the source/drain channel.

In some embodiments, the contact metal forms one or more wrap around contact structures around the source/drain channel.

In some embodiments, the method further includes applying a sacrificial gate electrode and oxide layer to form a gate cavity of the semiconductor device; and forming an interlayer dielectric (ILD) layer over portions of the channel layer that are not within the gate region.

In some embodiments, the method further includes applying a dielectric liner and metal gate material to the gate cavity.

In some embodiments, the method further includes depositing sidewall spacers along sidewalls of the sacrificial gate electrode to form the gate region between the sidewall spacers.

In some embodiments, the buffer layer is a first III-V semiconductor material and the channel layer is a second III-V semiconductor material.

In some embodiments, the channel layer comprises indium gallium arsenide (InGaAs).

In some embodiments, the buffer layer comprises gallium arsenide (GaAs)

In some embodiments, etching the one or more source/drain contact trenches in the ILD includes etching using a highly anisotropic plasma etch.

In some embodiments, etching the oxide isolation layer below the source/drain contact trench to form the one or more cavities under the source/drain channel layer includes an isotropic oxide etch or a dry etch.

In some embodiments, the buffer layer and the channel layer are layers of a multi-layer stack within a trench formed on the substrate.

In some embodiments, the semiconductor device is one of a trigate transistor or a nanowire device.

In some embodiments, a semiconductor device includes a gate channel below a gate contact for the device; a source/drain channel below source/drain portions of the device; and one or more metal contacts around the source/drain channel, wherein the one or more metal contacts are formed around the source/drain channel in one or more cavities etched around the source/drain channel.

In some embodiments, the one or more metal contacts are wrap around contacts for the source/drain channel that provide contact with all sides of the source/drain.

In some embodiments, the device further includes a buffer layer formed below the channel layer.

In some embodiments, the buffer layer is a first III-V semiconductor material and the channel layer is a second III-V semiconductor material.

In some embodiments, the channel layer comprises indium gallium arsenide (InGaAs).

In some embodiments, the buffer layer comprises gallium arsenide (GaAs).

In some embodiments, the semiconductor device is one of a trigate transistor or a nanowire device.

In some embodiments, a system includes one or more processors to process data; a transmitter or receiver and antenna for transmission or reception of data; and one or more semiconductor devices, a first semiconductor device including a gate channel below a gate contact for the device; a source/drain channel below source/drain portions of the device; and one or more metal contacts around the source/drain channel, wherein the one or more metal contacts are formed around the source/drain channel in one or more cavities etched around the source/drain channel.

In some embodiments, the one or more metal contacts are wrap around contacts for the source/drain channel that provide contact with all sides of the source/drain of the first semiconductor device.

In some embodiments, the first semiconductor device is one of a trigate transistor or a nanowire device.

What is claimed is:

1. A semiconductor device comprising:
  a gate channel below a gate contact for the device;
  a source/drain channel below source/drain portions of the device; and
  one or more metal contacts surrounding the source/drain channel;
  wherein the one or more metal contacts are formed surrounding the source/drain channel in one or more cavities etched around the source/drain channel.

2. The device of claim 1, wherein the one or more metal contacts are wrap around contacts for the source/drain channel that provide contact with all sides of the source/drain.

3. The device of claim 1, further comprising a buffer layer formed below the gate channel and the source/drain channel.

4. The device of claim 3, wherein the buffer layer is a first III-V semiconductor material and the channel layer is a second III-V semiconductor material.

5. The device of claim 4, wherein the channel layer comprises indium gallium arsenide (InGaAs).

6. The device of claim 4, wherein the buffer layer comprises gallium arsenide (GaAs).

7. The device of claim 1, wherein the semiconductor device is one of a trigate transistor or a nanowire device.

8. A system comprising:
  one or more processors to process data;
  a transmitter or receiver and antenna for transmission or reception of data; and
  one or more semiconductor devices, a first semiconductor device including:
    a gate channel below a gate contact for the device;
    a source/drain channel below source/drain portions of the device; and
    one or more metal contacts surrounding the source/drain channel;
    wherein the one or more metal contacts are formed around the source/drain channel in one or more cavities etched around the source/drain channel.

9. The system of claim 8, wherein the one or more metal contacts are wrap around contacts for the source/drain channel that provide contact with all sides of the source/drain of the first semiconductor device.

10. The system of claim 8, wherein the first semiconductor device is one of a trigate transistor or a nanowire device.

* * * * *